United States Patent [19]

Law et al.

[11] Patent Number: 4,616,212

[45] Date of Patent: Oct. 7, 1986

[54] TWO STAGE WEIGHTED CAPACITOR DIGITAL TO ANALOG CONVERTER

[75] Inventors: Simon M. Law, Torrance, Calif.; Bruce Long, Cary, N.C.

[73] Assignee: Xerox Corporation, Stamford, Conn.

[21] Appl. No.: 709,479

[22] Filed: Mar. 7, 1985

[51] Int. Cl.[4] .................................. H03K 13/03
[52] U.S. Cl. ................................... 340/347 DA
[58] Field of Search ............... 340/347 DA, 347 AD, 340/347 C

[56] References Cited

U.S. PATENT DOCUMENTS

| | | | |
|---|---|---|---|
| 3,307,173 | 2/1967 | Popodi et al. | 340/347 |
| 3,309,693 | 3/1967 | Davis | 340/347 |
| 3,558,918 | 1/1971 | Regitz | 340/347 |
| 3,603,981 | 9/1971 | Bellenhagen | 340/347 DA |
| 3,651,515 | 3/1972 | Carbrey | 340/347 DA |
| 3,651,518 | 3/1972 | Carbrey | 340/347 DA |
| 3,703,002 | 11/1972 | Van Saun | 340/347 AD |
| 3,836,906 | 9/1974 | Ando et al. | 340/347 DA |
| 4,055,773 | 10/1977 | Schoeff | 340/347 DA |
| 4,077,035 | 2/1978 | Yee | 340/347 DA |
| 4,146,882 | 3/1979 | Hoff, Jr. et al. | 340/347 DA |
| 4,160,244 | 7/1979 | Solomon et al. | 340/347 DA |
| 4,168,528 | 9/1979 | Comer | 340/347 DA |
| 4,186,383 | 1/1980 | Hofflinger et al. | 340/347 DA |
| 4,200,863 | 4/1980 | Hodges et al. | 340/347 AD |
| 4,311,988 | 1/1982 | Kelley et al. | 340/347 DA |

OTHER PUBLICATIONS

"A Segmented μ-255 Law PCM Voice Encoder Utilizing NMOS Technology", IEEE Journal of Solid State Circuits, vol. SC-11, No. 6, 12/76.

Primary Examiner—Vit W. Miska
Attorney, Agent, or Firm—Franklyn C. Weiss

[57] ABSTRACT

A weighted capacitor digital to analog converter is disclosed which requires two stages but only one conversion step. By the use of an applied reference voltage and two groups of capacitors, the outputs of each group being coupled to an amplifier and feedback capacitor circuit, various capacitors in these groups can be selectively switched from the reference voltage to ground potential in response to input binary digit signals thereby presenting a predetermined amount of voltage to the output amplifiers depending upon the number and particular combination of capacitors switched or non-switched to ground.

1 Claim, 1 Drawing Figure

TWO STAGE WEIGHTED CAPACITOR DIGITAL TO ANALOG CONVERTER

This invention relates to a weighted capacitor digital to analog converter which utilizes a reference voltage in conjunction with two groups of capacitors with each capacitor being selectively switched to ground potential to transfer a switched binary signal to the capacitors in order to convert an input signal to an output analog signal.

BACKGROUND OF THE INVENTION

Weighted capacitor digital to analog converters have been described in the prior art for use in converting a digital signal to an analog signal. Resistive arrays have not been satisfactory due to the low packing density and large non-linearity. Other weighted capacitor digital to analog converters either utilized too many conversion steps or too many components.

According to the present invention, a weighted capacitor digital to analog converter is disclosed which requires two stages but only one conversion step. By the use of an applied reference voltage and two groups of capacitors, the outputs of each group being coupled to an amplifier and feedback capacitor circuit, various capacitors in these groups can be selectively switched from the reference voltage to ground potential in response to input binary digit signals thereby presenting a predetermined amount of voltage to the output amplifiers depending upon the number and particular combination of capacitors switched or nonswitched to ground.

DESCRIPTION OF THE DRAWINGS

For a more complete understanding of the invention, reference may be had to the following detailed description of the invention in conjunction with the drawing wherein the FIGURE is a schematic diagram of the two stage weighted capacitor digital to analog converter in accordance with the principles of the present invention.

DETAILED DESCRIPTION OF THE INVENTION

Figure 1:
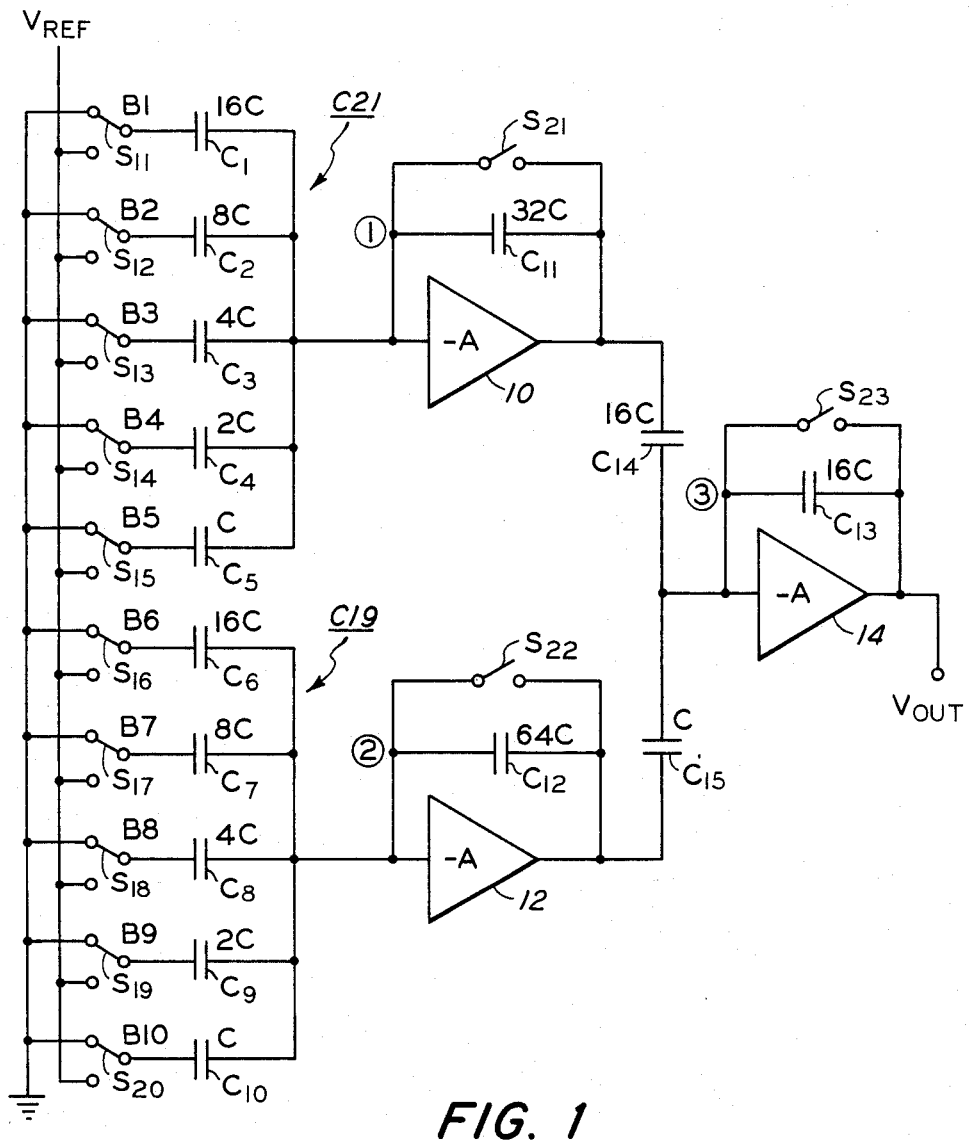

Certain technological development programs require a large quantity of digital to analog converters, such as for ink jet or other marking technology techniques. The design objectives of the digital to analog converters are high speed, with a conversion time of less than one microsecond, ten bit resolution and a high packing density. The following description refers to a ten bit implementation, but the invention can be extended to be applied to any digital to analog converter with any number of binary digits.

The invention utilizes two sets C19, C21 of binary weighted capacitors switched at the same time on an applied reference voltage V. Switches S11 through S20 would be switched in response to digital inputs B1 through B10 with B1 being the most significant bit and B10 being the least significant bit. Capacitors C1 through C5 comprise a first group of capacitors C21 or the most significant bit while capacitors C6 through C10 comprise a second group of capacitors C19 or the least significant bit. When a binary digit corresponding to a binary one is applied to any one of the switches S11 through S20, the selected switches S11 to S20 are switched from the reference voltage V to ground potential.

Switches S21 to S23 effectively reset the digital to analog converter by setting the output of amplifiers 10, 12, and 14 to the same reference potential as its input. That is, switch S21, when closed, effectively equalizes the potential across capacitor C11 such that when switch S21 is opened, there is no residual potential across capacitor C11. The same would apply to amplifiers 12 and 14.

The digital to analog conversion begins with switches S11 to S20 applying the reference voltage V to capacitors C1 to C10. Switches S21 to S23 would then be opened and the binary digits B1 to B10 would be applied to switches S11 to S20. A binary digit equal to one will change the application of the reference voltage to ground potential to discharge the select capacitor. The change in output voltage as amplified by amplifier 10 would then be.

$$V_{OUT} = V_{OR} - \frac{V_{ref}}{1 + \frac{33C}{16C}\frac{1}{A}} \left[ \frac{C_{21}}{32C + \frac{32C + C_T}{A}} + \frac{C_{19}}{32\left[32C + \frac{32C + C_T/2}{A}\right]} \right]$$

with $V_{OR}$ the reset output voltage
$C_T$ the total capacitance of one input array
$C_{21}$ the input capacitance switched in the MSB array
$C_{19}$ the input capacitance switched in the LSB array
A gain of the amplifier
where $b = 1$ if the bit is a digital one and $bi = 0$ if the bit is a digital zero, and the chosen values of C1 through C10 being various multiples of capacitive value C.

The output from capacitor group C21 would then be applied to amplifier 10, which, when S21 was initially closed, but now open, will charge capacitor C11. The output from capacitor group C19 would be applied to amplifier 12, which, when S22 was initially closed, but now open, will charge capacitor C12. The combined outputs of amplifiers 10 and 12 are applied to capacitors C14 and C15 and amplifier 14, similarly charge capacitor C13 by initially closing, but now open, switch S23.

Other ratios for capacitor values C1 through C15 can be chosen to define the analog voltage out for the various combination of binary digits applied.

Thus, one can adopt the values of the capacitors C11 through C14 equal to 32C to achieve the same transfer function.

By using the two stage technique, the maximum capacitive ratio is 64 to 1, utilizing the principles of the present invention instead of the 512 to 1 used in the conventional techniques. The reduction of capacitor ratio will result in a reduction of integrated circuit chip area. Another advantage would be that this weighted capacitor digital to analog converter system is not sensitive to parasitic capacitance. The single input amplifiers 10, 12 and 14 can be used for high speed because the input offset does not affect any performance of the digital to analog converter. Further, the present invention requires only one conversion step as compared with two digital to analog converters that require two conversion steps.

While the invention has been described with reference to specific embodiments, it will be understood by those skilled in the art that various changes may be made and equivalents may be substituted therefor without departing from the true spirit and scope of the invention. In addition, many modifications may be made without departing from the essential teachings of the invention.

What is claimed is:

1. (As Amended) A weighted capacitor digital to analog converter comprising:

a reference voltage (V), a first group of capacitors (C21), one electrode of each being mutually connected, a first group of switches (S11) for selectively connecting the other electrodes of said first group of capacitors to said reference voltage or ground potential, a second group of capacitors (C19), one electrode of each being mutually connected, a second group of switches (S16) for selectively connecting the other electrodes of said second group of capacitors to said reference voltage or ground potential, said first and second groups of switches being selectively switched upon a binary digital signal being applied to each of said switches, said digital to analog converter being parasitic insensitive, a first single input high speed amplifier means (10) for amplifying the output analog signal as received from said first group of capacitors, a first output capacitor (C11) coupling the output of said first amplifier means to said input of said first amplifier means for providing voltage feedback to said first amplifier, a first output switch (S21) coupled across said first output capacitor for neutralizing the charge on said first output capacitor and thereby neutralizing the output voltage in relation to the input voltage of said first amplifier means, a second single input high speed amplifier means (12) for amplifying the output analog signal as received from said second group of capacitors, a second output capacitor (C12) coupling the output of said second amplifier means to said input of said second amplifier means for providing voltage feedback to said second amplifier means, a second output switch (S22) coupled across said second output capacitor for neutralizing the charge on said second output capacitor and thereby neutralizing the output voltage in relation to the input voltage of said second amplifier means, and a third single input high speed amplifier means (14) for amplifying the output analog signal as received from said first and second amplifier means, a third output capacitor coupling the output of said third amplifier means to said input of said third amplifier means for providing voltage feedback to said first amplifier means, a third output switch coupled across said third output capacitor for neutralizing the charge on said third output capacitor and thereby neutralizing the output voltage in relation to the input voltage of said third amplifier means.

* * * * *